(12) United States Patent
Murata et al.

(10) Patent No.: US 6,363,881 B2
(45) Date of Patent: *Apr. 2, 2002

(54) PLASMA CHEMICAL VAPOR DEPOSITION APPARATUS

(75) Inventors: Masayoshi Murata; Yoshiaki Takeuchi; Hiroshi Mashima; Akemi Takano; Hirohisa Yoshida, all of Nagasaki-ken (JP)

(73) Assignee: Mitsubishi Heavy Industries, Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/232,600

(22) Filed: Jan. 19, 1999

(30) Foreign Application Priority Data

Apr. 28, 1998 (JP) ............................................. 10-119142

(51) Int. Cl.$^7$ ............................................. C23C 16/509
(52) U.S. Cl. ............................. 118/723 E; 118/723 MP; 315/248; 315/111; 156/89; 346/160; 219/121.43
(58) Field of Search ................ 118/723 MP, 723 E; 315/248, 111; 156/89; 346/160; 219/121.43

(56) References Cited

U.S. PATENT DOCUMENTS

| | | | |
|---|---|---|---|
| 3,569,777 A | * 3/1971 | Beaudry | 315/111 |
| 4,253,047 A | * 2/1981 | Walker et al. | 315/248 |
| 4,626,876 A | * 12/1986 | Miyagawa et al. | 346/160 |
| 4,652,318 A | * 3/1987 | Masuda et al. | 156/89 |
| 5,589,737 A | 12/1996 | Barnes et al. | 315/111.21 |
| 5,803,974 A | * 9/1998 | Mikoshiba et al. | 118/723 MP |
| 5,852,275 A | * 12/1998 | Signer | 219/121.43 |

FOREIGN PATENT DOCUMENTS

| | | |
|---|---|---|
| EP | 0949352 | 10/1999 |
| JP | 6342764 | 12/1994 |
| JP | 9071867 | 3/1997 |

OTHER PUBLICATIONS

Masayoshi Murata, et al. (1997) "Production of Inductively Coupled RF Plasma Using a Ladder–Shaped Antenna", Jpn. J. Appl. Phys., XP–002134392, vol. 36: 4563–4567 (Exhibit 3).

* cited by examiner

Primary Examiner—Gregory Mills
Assistant Examiner—Rudy Zervigon
(74) Attorney, Agent, or Firm—John P. White; Cooper & Dunham LLP

(57) ABSTRACT

Disclosed is a plasma chemical vapor deposition apparatus for forming an amorphous thin film, a microcrystalline thin film or a polycrystalline thin film on a surface of a target substrate by utilizing a glow discharge generated by an electric power supplied from a power source, comprising a reaction vessel, means for supplying a reactant gas into the reaction vessel, discharge means for discharge a waste gas of the reactant gas out of the reaction vessel, a ladder-shaped electrode for discharge generation arranged within the reaction vessel, a power source for supplying a high frequency power of 30 MHz to 200 MHz to the ladder-shaped electrode for a glow discharge generation, a heater for heating and supporting a target substrate, the heater being arranged within the reaction vessel in parallel to the ladder-shaped electrode for discharge generation, and a power distributor for uniformly distributing a high frequency power to the ladder-shaped electrode for discharge generation through a power supply wire.

4 Claims, 9 Drawing Sheets

(PRIOR ART) (PLASMA GENERATION IN PERIPHERAL REGION)

(PRIOR ART) (PLASMA GENERATION IN CENTRAL REGION)

PLASMA CHEMICAL VAPOR DEPOSITION APPARATUS

BACKGROUND OF THE INVENTION

The present invention relates to a plasma CVD (Chemical Vapor Deposition) apparatus for preparation of a thin film used in various electronic devices such as an amorphous silicon solar cell, a microcrystalline solar cell, a thin film polycrystalline solar cell, a thin film semiconductor device, an optical sensor, and a semiconductor protective film.

Various plasma CVD apparatuses are used for preparation of an amorphous silicon (hereinafter referred to as "a-Si") thin film, a microcrystalline thin film, a polycrystalline thin film, or a silicon nitride (hereinafter referred to as "SiNx") thin film. The conventional plasma CVD apparatus can be classified typically into a type in which is used a ladder type electrode for discharge generation and another type in which are used plate electrodes arranged in parallel. The ladder type electrode includes, for example, a ladder antenna electrode and a ladder inductance electrode.

Japanese Patent Disclosure (Kokai) No. 4-236781 discloses a plasma CVD apparatus using a ladder type electrode of various shapes. FIG. 10 shows a typical example of the plasma CVD apparatus disclosed in JP '781 quoted above. As shown in the drawing, a ladder type electrode 2 for discharge generation and a heater 3 for heating a substrate are arranged in parallel within a reaction vessel 1. A high frequency power having a frequency of, for example, 13.56 MHz is supplied from a high frequency power source 4 to the ladder type electrode 2 for discharge generation through an impedance matching device 5. As shown in FIG. 11, the ladder type electrode 2 for discharge generation is connected at one end to the high frequency power source 4 via the impedance matching device 5 and is also connected at the other end to a ground lead 7 and, thus, to the ground. Also, the reaction vessel 1 is connected to the ground.

The high frequency power supplied to the ladder type electrode 2 for discharge generation serves to generate a glow discharge plasma in a free space between the substrate heater 3, which is also connected to the ground together with the reaction vessel 1, and the ladder type electrode 2 for discharge generation. After generation of the glow discharge plasma, the high frequency power flows through the discharge space into the wall of the reaction vessel 1 and into the ground through the ground lead 7 connected to the ladder type electrode 2. A coaxial cable is used as the ground lead 7.

A mixed gas consisting of, for example, monosilane and hydrogen is supplied from a bomb (not shown) into the reaction vessel 1 through a reactant gas introducing pipe 8. The reactant gas introduced into the reaction vessel 1 is decomposed by a glow discharge plasma generated by the ladder electrode 2 for discharge generation so as to be deposited on a substrate 9 disposed on the heater 3 and heated to a predetermined temperature. On the other hand, the gas within the reaction vessel 1 is exhausted by a vacuum pump 11 through an exhaust pipe 10.

In preparing a thin film by using the apparatus described above, the inner space of the reaction vessel 1 is exhausted first by operating the vacuum pump 11, followed by introducing a mixed gas consisting of, for example, monosilane and hydrogen into the reaction vessel 1 through the reactant gas introducing pipe 8. In this step, the inner pressure of the reaction vessel 1 is maintained at 0.05 to 0.5 Torr. Under this condition, a high frequency power is supplied from the high frequency power source 4 to the ladder type electrode 2 for discharge generation so as to generate a glow discharge plasma. Therefore, the reactant gas is decomposed by the glow discharge plasma generated in the free space between the ladder type electrode 2 and the substrate heater 3 so as to generate Si-containing radicals such as $SiH_3$, and $SiH_2$. These radicals are attached to a surface of the substrate 9 so as to form an a-Si thin film.

FIG. 12 shows another type of the conventional plasma CVD apparatus in which are used plate electrodes arranged in parallel. As shown in the drawing, the apparatus comprises a reaction vessel 21. A high frequency electrode 22 and a substrate heater 23 are arranged in parallel within the reaction vessel 21. A high frequency having a frequency of, for example, 13.56 MHz is supplied from a high frequency power source 24 to the high frequency electrode 22 through an impedance matching device 25. The substrate heater 23 is connected to the reaction vessel 21. Also, the reaction vessel 21 is connected to the ground. It follows that the substrate heater 23 is indirectly connected to the ground to constitute a ground electrode, with the result that a glow discharge plasma is generated in the free space between the high frequency electrode 22 and the substrate heater 23.

A mixed gas consisting of, for example, monosilane and hydrogen is supplied from a bomb (not shown) into the reaction vessel 21 through a reactant gas introducing pipe 26. On the other hand, the gas within the reaction vessel 21 is exhausted by a vacuum pump 28 through an exhaust pipe 27. A substrate 29 is disposed on the substrate heater 23 so as to be heated to a predetermined temperature.

For forming a thin film by using the apparatus shown in FIG. 12, the inner space of the reaction vessel 21 is exhausted first by operating the vacuum pump 28, followed by introducing a mixed gas consisting of, for example, monosilane and hydrogen into the reaction vessel 21 through the reactant gas introducing pipe 26. In this step, the inner pressure of the reaction vessel 21 is maintained at 0.05 to 0.5 Torr. If a high frequency power is supplied from the high frequency power source 24 to the high frequency electrode 22, a glow discharge plasma is generated within the reaction vessel.

The monosilane gas contained in the mixed gas supplied through the reactant gas introducing pipe 26 into the reaction vessel 21 is decomposed by the glow discharge plasma generated in the free space between the high frequency electrode 22 and the substrate heater 23 so as to generate Si-containing radicals such as $SiH_3$ and $SiH_2$. These Si-containing radicals are attached to a surface of the substrate 29 so as to form an a-Si thin film.

However, any of the prior arts using a ladder type electrode and plate electrodes arranged in parallel gives rise to problems as described below.

(1) In the apparatus shown in FIG. 11, a reactant gas, e.g., $SiH_4$, is decomposed by an electric field generated in the vicinity of the ladder type electrode 2 into Si, SiH, $SiH_2$, $SiH_3$, H, $H_2$, etc. so as to form an a-Si film on the surface of the substrate 9. However, if the frequency of the high frequency power is increased from the present level of 13.56 MHz to 30 to 150 MHz in an attempt to increase the rate of forming the a-Si film, the electric field in the vicinity of the ladder type electrode fails to be distributed uniformly, leading to a markedly poor uniformity in the thickness of the formed a-Si film. FIG. 13 is a graph showing the relationship between the plasma power source frequency and the film thickness distribution in respect of a substrate having an area of 30 cm×30 cm. It should be noted that the size of the substrate which permits ensuring a uniformity in the film thickness distribution, i.e., deviation of ±10% from an average film thickness, is 5 cm×5 cm to 20 cm×20 cm.

The reason why it is difficult to increase the frequency of the high frequency power source 4 in the apparatus using a ladder type electrode is as follows. Specifically, non-uniformity of impedance derived from the construction of the ladder type electrode is inherent in the apparatus shown in FIG. 10, with the result that a strong plasma light emission is localized, as shown in FIG. 14. For example, a strong plasma is generated in a peripheral portion alone of the ladder type electrode, and is not generated in a central portion. The difference in the plasma density between the peripheral portion and the central portion of the ladder type electrode is rendered prominent particularly where the frequency of the high frequency power source is increased to 60 MHz or more.

Under the circumstances, it is very difficult and considered substantially impossible to increase the film forming rate by increasing the frequency of the plasma power source when it comes to a large substrate required for improving the mass productivity and cost reduction. It should be noted that the film forming rate of a-Si is proportional to the square of the frequency of the plasma power source. Therefore, vigorous researches are being made in this technical field on the technology to increase the frequency of the plasma power source. However, a successful result has not yet been reported in the case of a large substrate.

(2) In the apparatus shown in FIG. 12, a reactant gas, e.g., $SiH_4$, is decomposed by an electric field generated in the free space between the high frequency electrode 22 and the substrate heater 23 into Si, SiH, $SiH_2$, $SiH_3$, H, $H_2$, etc. so as to form an a-Si film on the surface of the substrate 29. However, if the frequency of the high frequency power is increased from the present level of 13.56 MHz to 30 to 200 MHz in an attempt to increase the rate of forming the a-Si film, the electric field generated in the free space between the high frequency electrode 22 and the substrate heater 23 fails to be distributed uniformly, leading to a markedly poor uniformity in the thickness of the formed a-Si film. FIG. 13 is a graph showing the relationship between the plasma power source frequency and the film thickness distribution in respect of a substrate having an area of 30 cm×30 cm. It should be noted that the size of the substrate which permits ensuring a uniformity in the film thickness distribution, i.e., deviation of ±10% from an average film thickness, is 5 cm×5 cm to 20 cm×20 cm.

The reason why it is difficult to increase the frequency of the high frequency power source 24 in the apparatus using plate electrodes arranged in parallel is as follows. Specifically, the peripheral portion and the central portion of the parallel plate type electrodes differ from each other in the electrical characteristics, with the result that a strong plasma is generated in the peripheral portions of the parallel electrodes 22 and 23 as shown in FIG. 15A, or a strong plasma is generated in the central portion alone of the parallel electrodes 22 and 23 as shown in FIG. 15B.

Under the circumstances, it is very difficult and considered substantially impossible to increase the film forming rate by increasing the frequency of the plasma power source when it comes to a large substrate required for improving the mass productivity and cost reduction. It should be noted that the film forming rate of a-Si is proportional to the square of the frequency of the plasma power source. Therefore, vigorous researches are being made in this technical field on the technology to increase the frequency of the plasma power source. However, a successful result has not yet been reported in the case of a large substrate.

BRIEF SUMMARY OF THE INVENTION

An object of the present invention is to provide a plasma chemical vapor deposition apparatus, in which is used a power distributor for uniformly distributing a high frequency power to a ladder-shaped electrode through a power supply wire for vacuum, making it possible to obtain a film thickness distribution markedly superior to that obtained in the conventional apparatus.

Another object of the present invention is to provide a plasma chemical vapor deposition apparatus, comprising an impedance matching device which is connected at one end to a high frequency power source for supplying a high frequency power of 30 MHz to 200 MHz for a glow discharge generation to a ladder-shaped electrode for discharge generation and at the other end to the power distributor noted above so as to obtain a further improved film thickness distribution.

Still another object is to provide a plasma chemical vapor deposition apparatus, in which an impedance converter is interposed between a ladder-shaped electrode and a power distributor, at least two ladder-shaped electrodes are arranged on a plane parallel to a heater for heating a substrate, and the high frequency power generated from the power source is supplied to the ladder-shaped electrodes for discharge generation through the impedance matching device, the power distributor and a coaxial cable for vacuum, thereby making it possible to use the plasma chemical vapor deposition apparatus for forming a uniform a-Si thin film having such a large area as about 1 m×2 m, a uniform microcrystalline silicon thin film having such a large area as about 1 m×2 m, and a uniform polycrystalline silicon thin film having such a large area as about 1 m×2 m.

According to one embodiment of the present invention, there is provided a plasma chemical vapor deposition apparatus for forming an amorphous thin film, a microcrystalline thin film or a polycrystalline thin film on a surface of a target substrate by utilizing a glow discharge generated by an electric power supplied from a power source, comprising:

a reaction vessel;

means for supplying a reactant gas into the reaction vessel;

discharge means for discharge a waste gas of the reactant gas out of the reaction vessel;

a ladder-shaped electrode for discharge generation arranged within the reaction vessel;

a power source for supplying a high frequency power of 30 MHz to 200 MHz to the ladder-shaped electrode for a glow discharge generation;

a heater for heating and supporting a target substrate, the heater being arranged within the reaction vessel in parallel to the ladder-shaped electrode for discharge generation; and a power distributor for uniformly distributing a high frequency power to the ladder-shaped electrode for discharge generation through an electric wire for vacuum.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
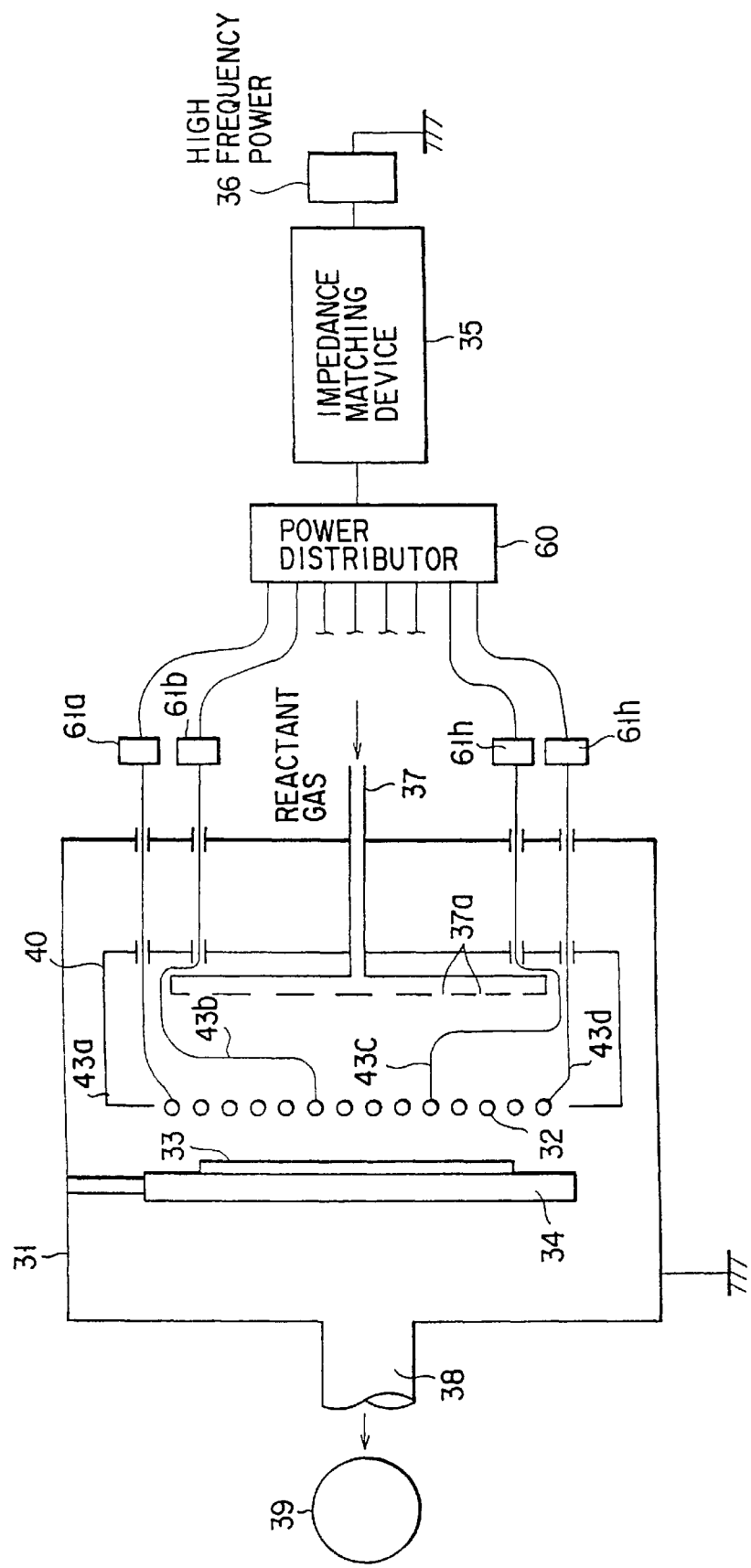
FIG. 1 shows the entire construction of a plasma CVD apparatus according to Example 1 of the present invention.

Let us describe the present invention more in detail.

In the present invention, it is desirable to arrange an impedance converter which is electrically connected at one end to a ladder-shaped electrode and at the other end to a power distributor in order to obtain a further improved film thickness distribution.

The power distributor used in the present invention comprises a high frequency transformer of 30 MHz to 200 MHz, a resistor and a capacitor. The high frequency power is distributed by the power distributor to a plurality of power supply terminals of a ladder-shaped electrode. These power supply terminals are formed at a peripheral portion of the ladder-shaped electrode and includes at least two terminals formed at any of the upper side, lower side, right side and left side of the ladder-shaped electrodes. For example, two power supply terminals are formed at each of the upper and lower sides of the ladder-shaped electrode, totaling four power supply terminals. Alternatively, four power supply terminals are formed at each of the right side and left side of the ladder-shaped electrode, totaling eight power supply terminals. The high frequency power for glow discharge generation is distributed uniformly to the ladder-shaped electrode via power supply wires and the power supply terminals of the ladder-shaped electrode.

The high frequency transformer comprises an annular body made of a magnetic material and two electrical wires each covered with an insulating material. These electrical wires are wound about the annular body and connected at one end to a single terminal and branched at the other end so as to be connected to two terminals.

In the present invention, an impedance matching device is arranged intermediate between the power source and the power distributor so as to be electrically connected to each of these power source and power distributor. It is desirable to arrange at least two ladder-shaped electrodes within a plane parallel to the heater for heating a substrate on which a thin film is to be formed. It is also desirable to supply a high frequency power generated in the power source to the ladder-shaped electrode through the impedance matching device, the power distributor and a coaxial cable for vacuum. These particular constructions are effective for forming a uniform a-Si thin film having such a large area as about 1 m×2 m, a uniform microcrystalline silicon thin film having such a large area as about 1 m×2 m, and a uniform polycrystalline silicon thin film having such a large area as about 1 m×2 m by using the power distributor for uniformly distributing a high frequency power to a plurality of power supply wires.

In the present invention, it is desirable to supply a high frequency power having a frequency of 30 MHz to 200 MHz, which is generated in a high frequency power source, to the ladder-shaped electrode through the impedance matching device, the power distributor, and the impedance converter.

The plasma chemical vapor deposition apparatus of the present invention comprises a single or a plurality of ladder-shaped electrodes for discharge generation. Also, a high frequency power having a frequency of 30 MHz to 200 MHz, which is generated in a high frequency power source, is supplied to the ladder-shaped electrode through the impedance matching device, the power distributor, the impedance converter, the current supply terminals and the coaxial cable for vacuum. The particular construction of the present invention makes it possible to obtain a film thickness distribution markedly superior to that in the conventional technique. Also, a thin film can be formed on a substrate having a large area, which is several times as large as that in the prior art.

The plasma chemical vapor deposition apparatus of the present invention can be effectively used for forming an amorphous silicon thin film. It should also be noted that a plasma CVD technology utilizing a high frequency power of 30 MHz to 200 MHz can be used for manufacturing a microcrystalline silicon thin film and a polycrystalline silicon thin film. In this sense, the present invention has a very high industrial value in the manufacture of a solar cell, a thin film transistor, a photosensitive drum, etc.

EXAMPLES

Let us describe some examples of the present invention with reference to the accompanying drawings.

Example 1

Figure 2:
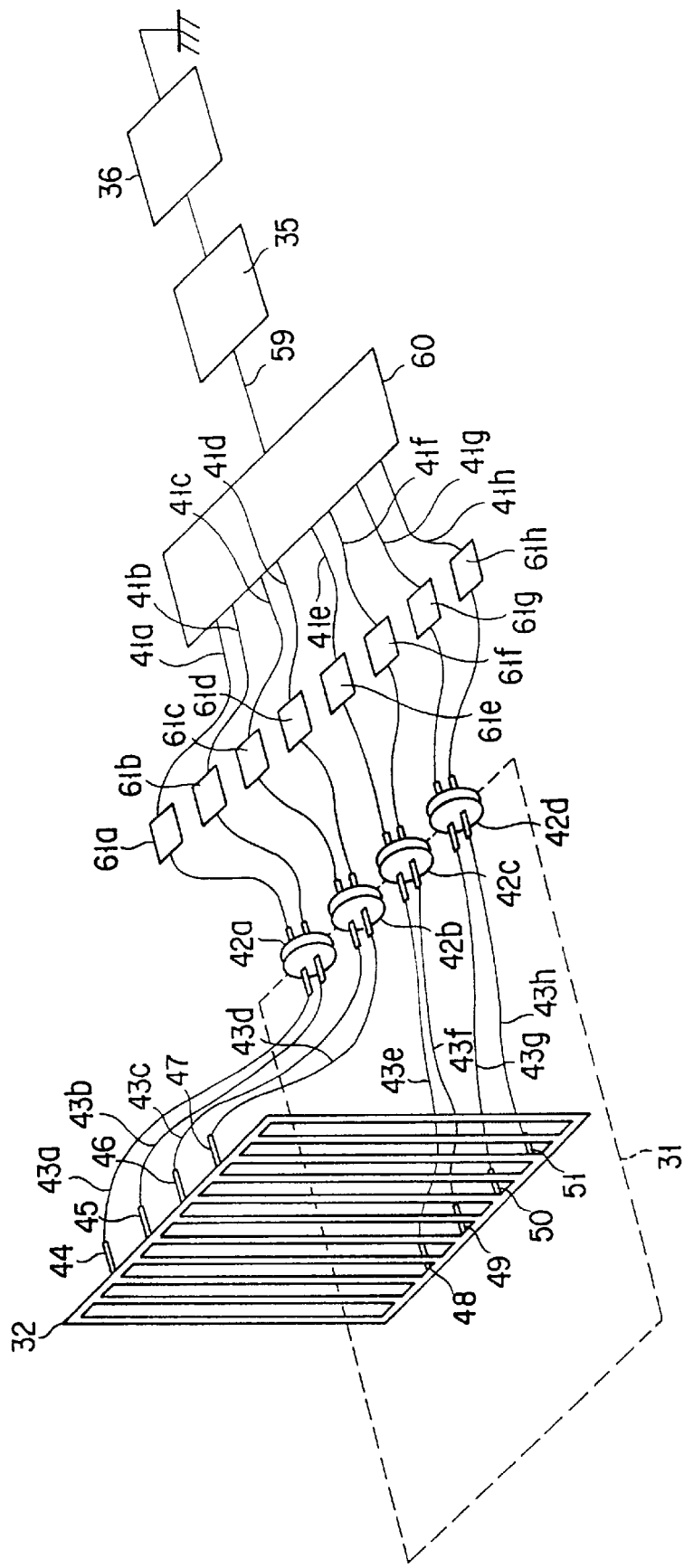
FIG. 2 shows the electric wiring system for supplying a high frequency power to the ladder-shaped electrode for discharge generation which is included in the plasma CVD apparatus shown in FIG. 1.

FIGS. 1 and 2 collectively show a plasma chemical vapor deposition apparatus according to a first embodiment of the present invention. As shown in the drawings, the apparatus of the present invention comprises a reaction vessel 31. Arranged within the reaction vessel 31 are a ladder-shaped electrode 32 for glow discharge plasma generation and a heater 34. The electrode 32 is made of SUS 304. A substrate 33 on which a thin film is to be formed is supported by the heater 34. The temperature of the substrate 33 is controlled by the heater 34. Further, a reactant gas introducing pipe 37 for introducing a reactant gas into a region in the vicinity of the ladder-shaped electrode 32 is arranged within the reaction vessel 31. As shown in the drawing, reactant gas discharge ports 37a of the reactant gas introducing pipe 37 are positioned to face the ladder-shaped electrode 32.

A vacuum pump 39 is connected to the reaction vessel 31 so as to discharge the waste gas from within the reaction vessel 31 through a discharge pipe 38. An earth shield 40, which is also arranged within the reaction vessel 31, serves to suppress the discharge generation in undesired portions within the reaction vessel 31. It should be noted that a reactant gas such as $SiH_4$ introduced through the reactant gas introducing pipe 37 into the reaction vessel 31 is converted into plasma by the glow discharge from the ladder-shaped electrode 32. The waste gas after the plasma formation and reaction products are discharged to the outside of the reaction vessel through the discharge pipe 38 by operating the vacuum pump 38. The earth shield 40 is also effective for assisting the waste gas discharge to the outside of the reaction vessel 31. Incidentally, the pressure within the reaction vessel 31 is monitored by a pressure gage (not shown) and is controlled by adjusting the discharge rate of the vacuum pump 39.

If a $SiH_4$ plasma is generated by the ladder-shaped electrode 32 for discharge generation, the radicals present in the plasma such as $SiH_3$, $SiH_2$ and $SiH$ are diffused so as to be adsorbed on a surface of the substrate 33. As a result, an amorphous silicon thin film, a microcrystalline silicon thin film or a polycrystalline silicon thin film is deposited on the surface of the substrate 33. Incidentally, the amorphous silicon thin film, the microcrystalline silicon thin film or the polycrystalline silicon thin film can be formed by a known technique by controlling appropriately the flow rate ratio of $SiH_4$ to $H_2$, pressure, and high frequency power for plasma generation. The following description covers the case an amorphous silicon thin film is formed by using a $SiH_4$ gas as a reactant. Of course, a microcrystalline silicon thin film and a polycrystalline silicon thin film can also be formed by the plasma CVD apparatus of the present invention.

A high frequency power source 36 is connected to the ladder-shaped electrode 32 for discharge generation through power supply wires, which are to be described herein later, the impedance converters 61a, 61b, 61c, 61d, 61e, 61f, 61g, 61h, the power distributor 60 and the impedance matching device 35.

FIG. 2 shows the electric wiring system for supplying a high frequency power to the ladder-shaped electrode 32 for discharge generation. As shown in the drawing, a high frequency power having a frequency of, for example, 60 MHz is supplied from the high frequency power source 36 to the ladder-shaped electrode 32 through the impedance matching device 35, the power distributor 60, the coaxial cables 41a, 41b, 41c, 41d, 41e, 41f, 41g, 41h, the current introducing terminals 42a, 42b, 42c, 42d, the coaxial cables (power supply wires) 43a, 43b, 43c, 43d, 43e, 43f, 43g, 43g for vacuum, and eight power supply terminals 44 to 51 welded to the ladder-shaped electrode 32 for discharge generation. The ladder-shaped electrode 32 has an outer dimension of 572 mm×572 mm, and is made of SUS rods having a diameter of 6 mm. The distance between the centers of the adjacent SUS rods is 26 mm.

Figure 3:
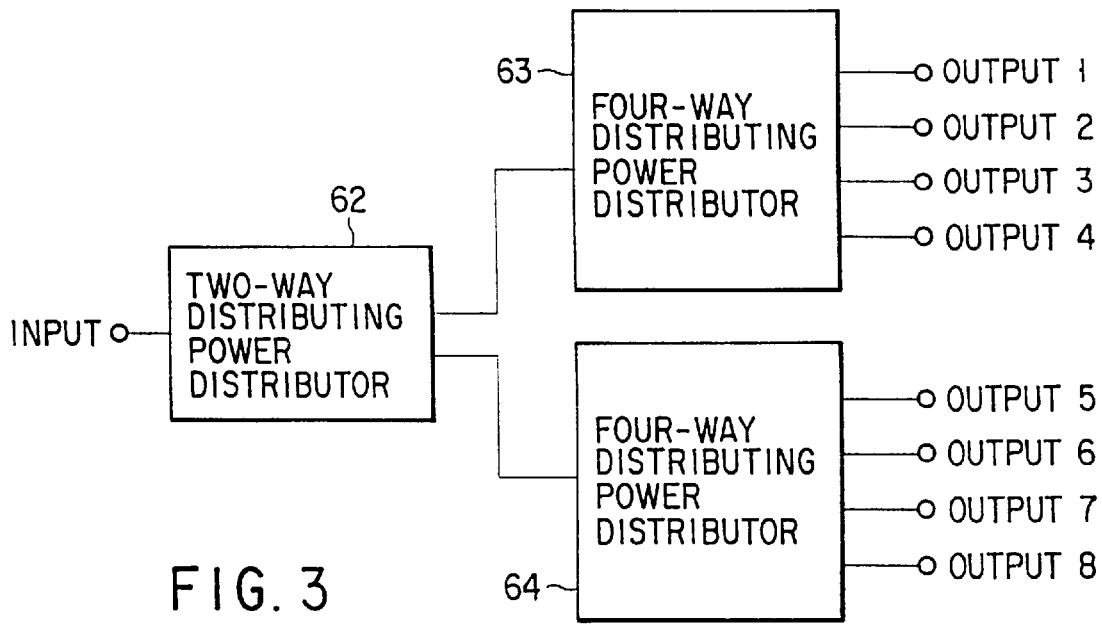
FIG. 3 shows the construction of the power distributor included in the plasma CVD apparatus shown in FIG. 1.
Figure 4:
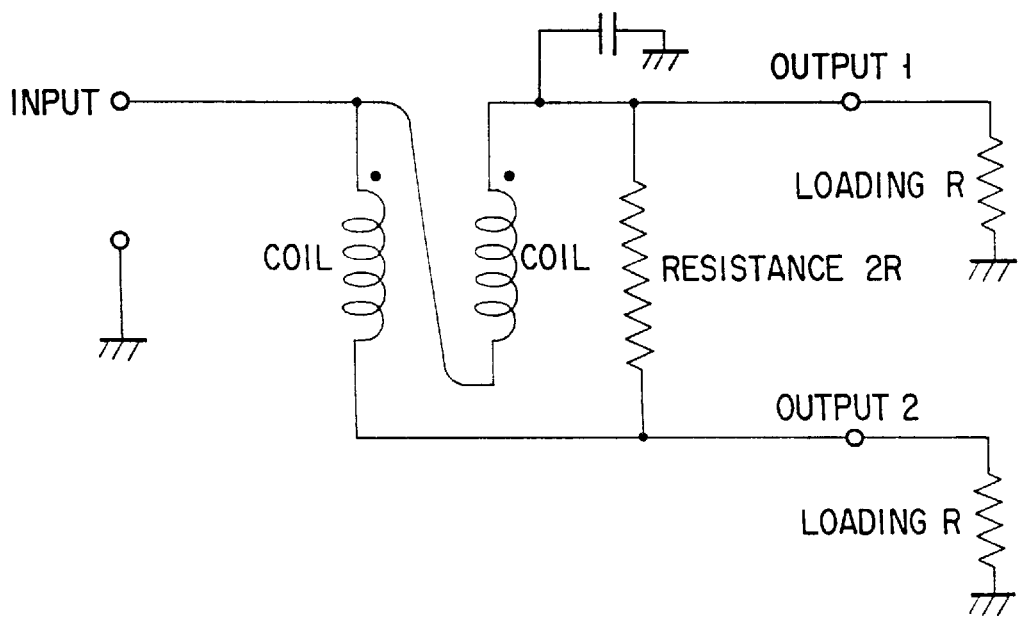
FIG. 4 shows the operating principle of one embodiment of the power distributor shown in FIG. 3.
Figure 5:
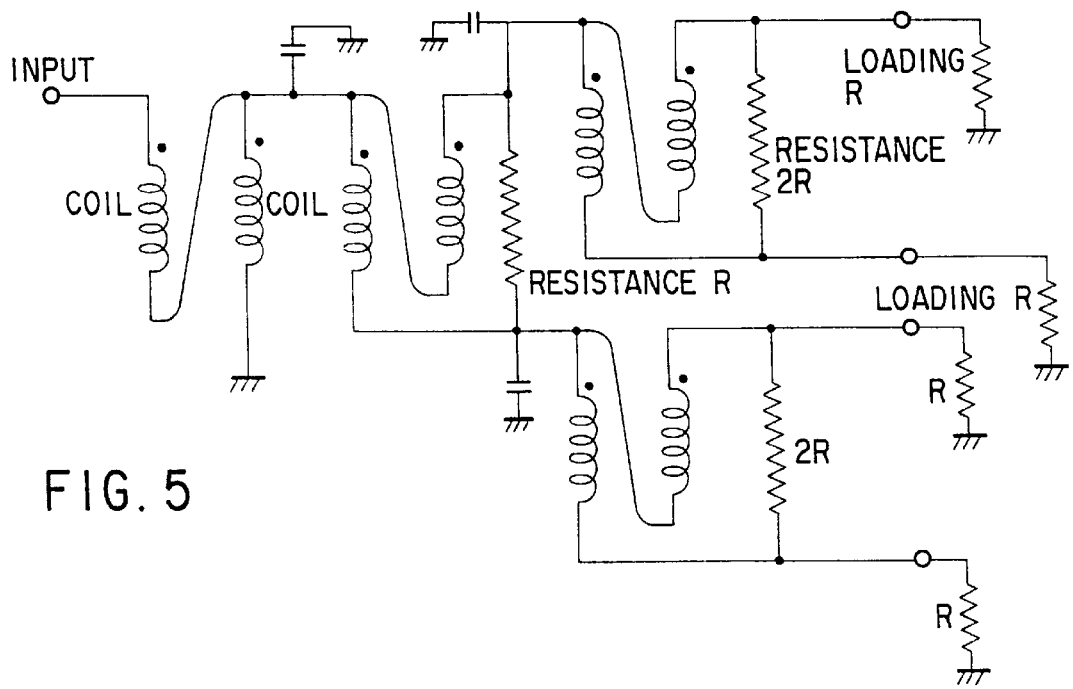
FIG. 5 shows the operating principle of another embodiment of the power distributor shown in FIG. 3.
Figure 6:
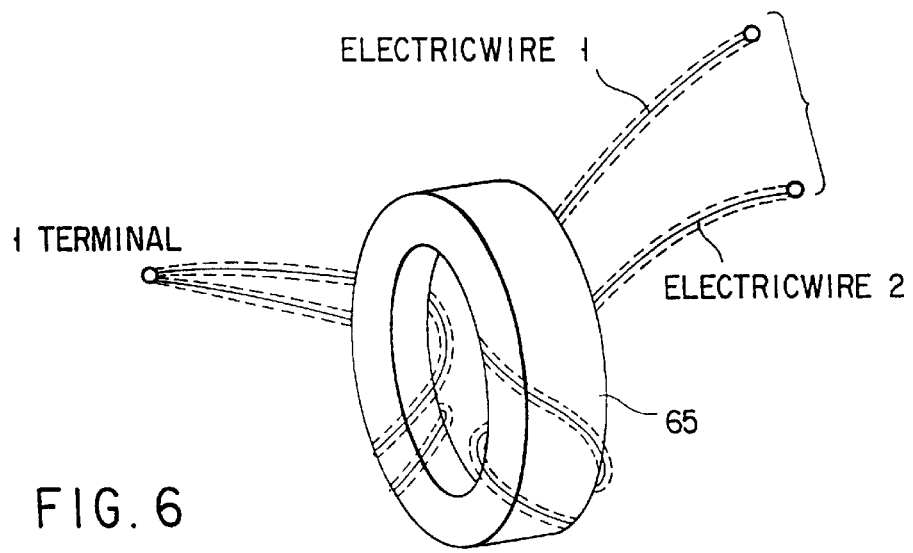
FIG. 6 shows the construction of a high frequency transformer included in the power distributor shown in FIG. 3.

As shown in FIG. 3, the power distributor 60 comprises a two-way distributing power distributor 62 for distributing the received high frequency power into two output terminals and two additional four-way distributing power distributors 63 and 64 connected to the output terminals of the two-way power distributor 62. The four-way power distributor 63 serves to distribute the high frequency power supplied from the two-way power distributor 62 into four output terminals to generate four outputs, i.e., output 1, output 2, output 3 and output 4. Likewise, the four-way power distributor 64 serves to distribute the high frequency power supplied from the two-way power distributor 62 into four output terminals to generate four outputs, i.e., output 5, output 6, output 7 and output 8. It follows that the high frequency power supplied to the power distributor 60 is uniformly divided into eight output terminals. These two-way power distributor and four-way power distributor forming the power distributor 60 are formed in principle of electrical circuits shown in FIGS. 4 and 5, respectively. Further, FIG. 6 shows the concept of the high frequency transformer included in the two-way distributing power distributor noted above.

Figure 7:
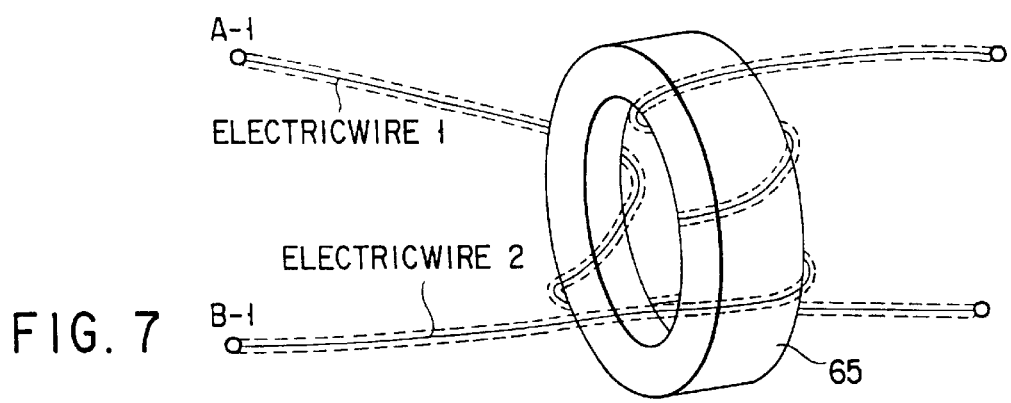
FIG. 7 shows the construction of an impedance matching device included in the plasma CVD apparatus shown in FIG. 1.

Impedance converters 61a to 61h are included in the plasma CVD apparatus of the present invention in order to achieve the impedance matching among the power distributor 60, the coaxial cables 43a to 43h, and the ladder-shaped electrode 32 for discharge generation. As shown in FIG. 7, each of these impedance converters comprises an annular body 65 made of ferrite and two electrical wires each covered with an insulating material. These insulated electrical wires are wound about the ferrite annular body 65 in a manner to provide a transformer winding ratio of 2:3.

In manufacturing an amorphous silicon thin film by using the plasma CVD apparatus of the construction described above, the vacuum pump 39 is operated in the first step so as to evacuate the inner space of the reaction chamber 31 to a vacuum of 2 to $3 \times 10^{-7}$ Torr. Then, a reactant gas, e.g., a $SiH_4$ gas, is supplied through the reactant gas introducing pipe 37 into the reaction vessel 31 at a flow rate of about 500 to 800 SCCM, followed by supplying a high frequency power of, for example, 60 MHz from the high frequency power source 36 to the ladder-shaped electrode 32 for discharge generation through the impedance matching device 35, the power distributor 60, the impedance converters 61a to 61h and the coaxial cables 43a to 43h for vacuum, while maintaining the inner pressure of the reaction vessel 31 at 0.05 to 0.5 Torr. As a result, a glow discharge plasma of $SiH_4$ is generated in the vicinity of the ladder-shaped electrode 32 for discharge generation. The plasma thus generated serves to decompose the $SiH_4$ gas so as to form an amorphous silicon thin film on the surface of the substrate 33.

Incidentally, the film forming rate, which is also dependent on the frequency of the high frequency power generated from the power source 36 and on the output of the power source 36, is about 0.5 to 3 nm/s.

Table 1 shows as an example the results of a film-forming experiment for Example 1.

TABLE 1

|  | film forming rate | film thickness distribution (deviation from average thickness) |
|---|---|---|
| where the impedance converters 61a to 61h are not used | 1.2 nm/s | ±8% |
| where the impedance converters 61a to 61h are used | 1.2 nm/s | ±5% |

(power source frequency 60 MHz, substrate area 40 cm×50 cm)

In this experiment, an amorphous silicon (a-Si) thin film was formed on a glass plate, i.e., trade name of "Corning #7059" manufactured by Corning Inc., having an area of 40 cm×50 cm and heated to 170° C. under a high frequency power of 500 W having a frequency of 60 MHz, a $SiH_4$ gas flow rate of 800 SCCM, and a pressure of 0.13 Torr. Where the impedance converters 61a to 61h were not used, the film forming rate was found to be 1.2 nm/s and the film thickness distribution was found to be ±8%. On the other hand, in the case of using the impedance converts 61a to 61h, the film forming rate was found to be 1.2 nm/s and the film thickness distribution was found to be ±5%, indicating a marked improvement in the film thickness distribution.

Incidentally, in the manufacture of an a-Si solar cell, a thin film transistor and a photosensitive drum, no problem in performance is brought about if the film thickness distribution is ±10%.

In Example 1 described above, it was possible to obtain a highly satisfactory film thickness distribution, compared with the conventional apparatus and method, under a high frequency power of 60 MHz. Although the frequency of the high frequency power used in Example 1 was 60 MHz, the power distributor 60 and the impedance converters 61a to 61h included in the plasma CVD apparatus of the present invention are fully capable of withstanding the application of high frequency power of 80 MHz to 200 MHz. It follows that the plasma CVD apparatus of the present invention can be used satisfactorily for forming an a-Si thin film under a high frequency power of 80 MHz to 200 MHz.

In the conventional plasma CVD apparatus, however, the film thickness distribution was markedly poor in the case of using a high frequency power of 30 MHz or more, making it impossible to put the conventional apparatus to a practical use for forming a thin film on a large substrate having an area of about 30 cm×30 cm to 50 cm×50 cm.

It should be noted that the coaxial cable for vacuum included in the plasma CVD apparatus of the present invention includes a plurality of core wires which are stranded together in place of a single core wire. In the case of using stranded core wires, the surface area of the core wires is increased so as to markedly diminish the skin effect which causes a power loss under a high frequency region.

Example 2

Figure 8:
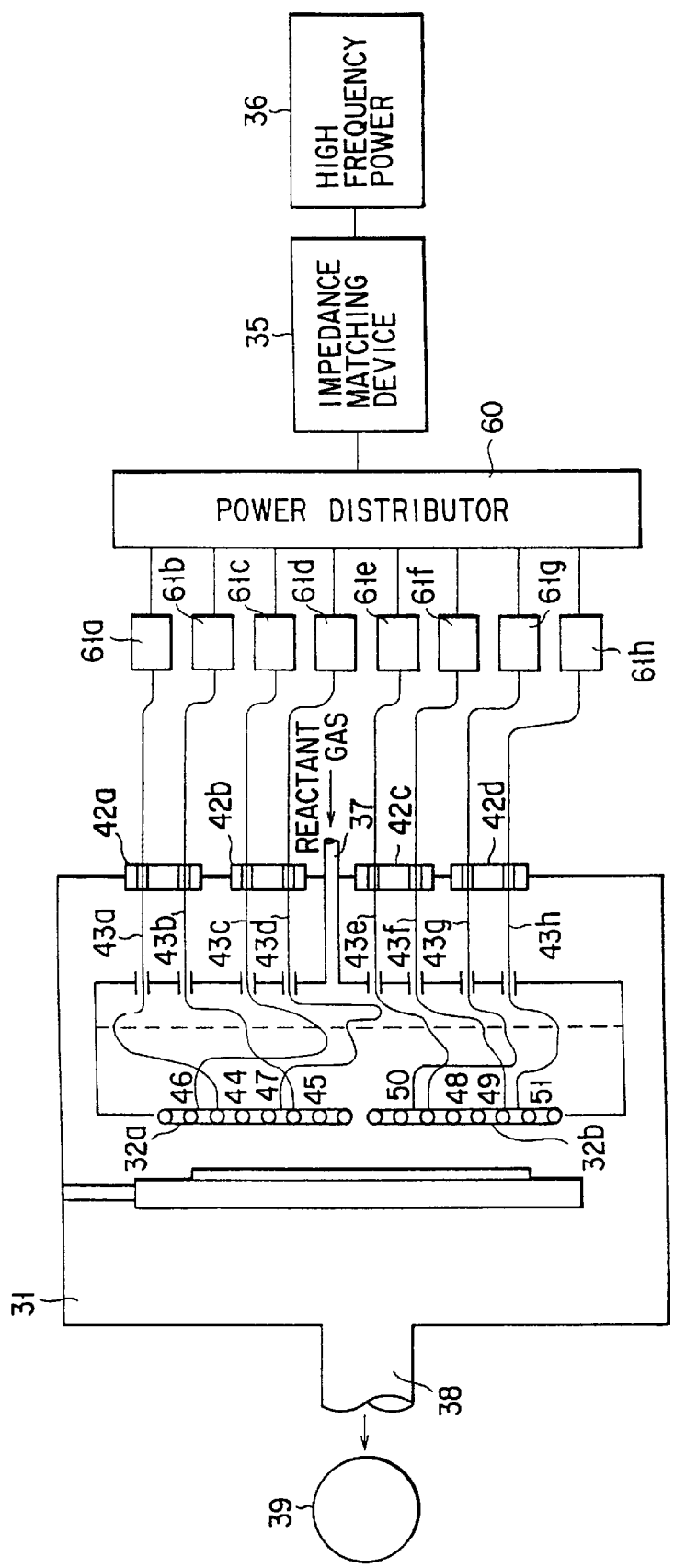
FIG. 8 shows the entire construction of a plasma CVD apparatus according to Example 2 of the present invention.
Figure 9:
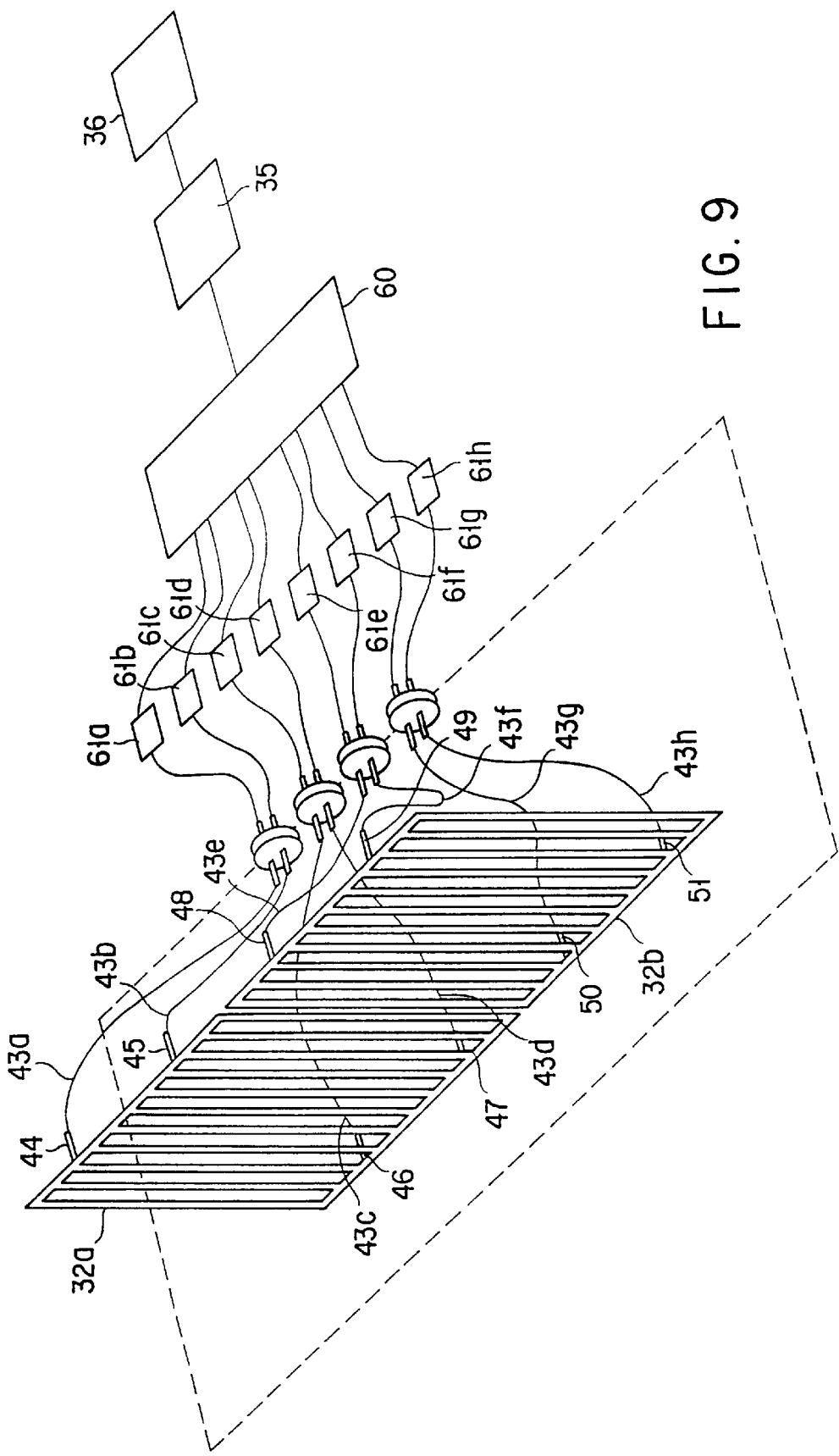
FIG. 9, which is supplementary to FIG. 8, shows an electric wiring system for supplying a high frequency power to two ladder-shaped electrodes.
Figure 10:
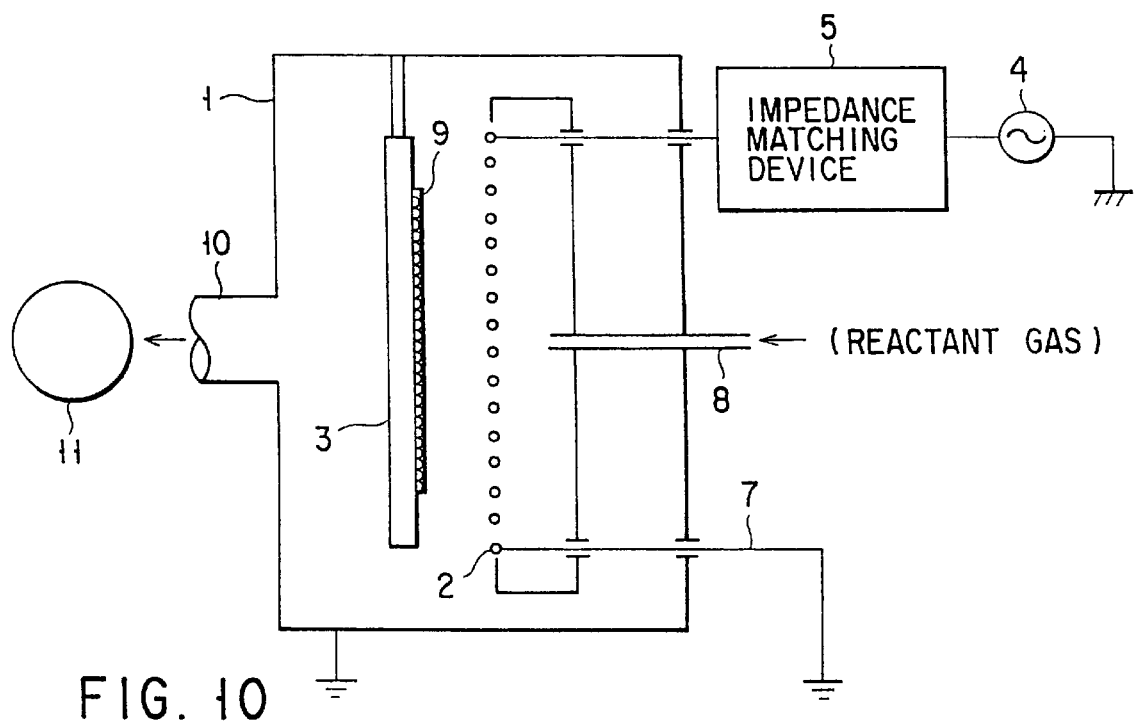
FIG. 10 shows the entire construction of a conventional plasma CVD apparatus using a ladder inductance electrode.
Figure 11:
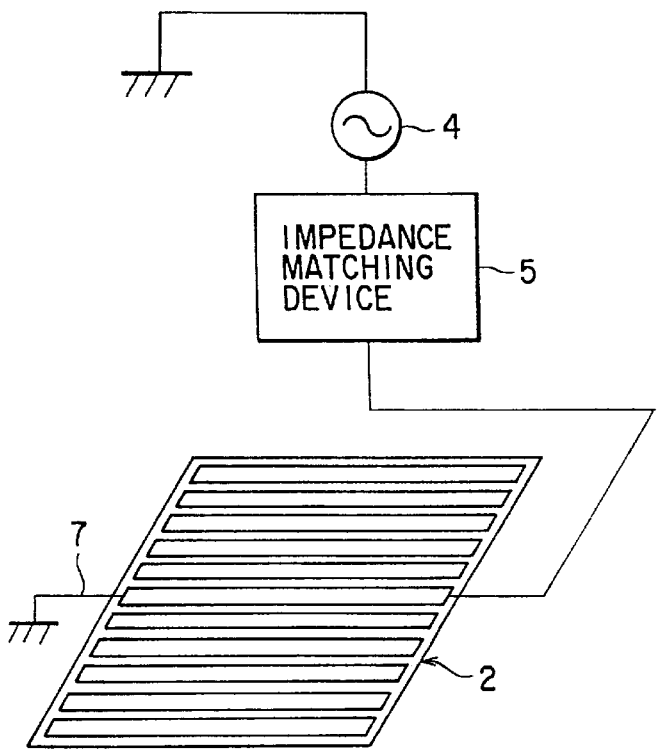
FIG. 11 shows an electric wiring system for supplying a high frequency power to the ladder-shaped electrode included in the conventional plasma CVD apparatus shown in FIG. 10.
Figure 12:
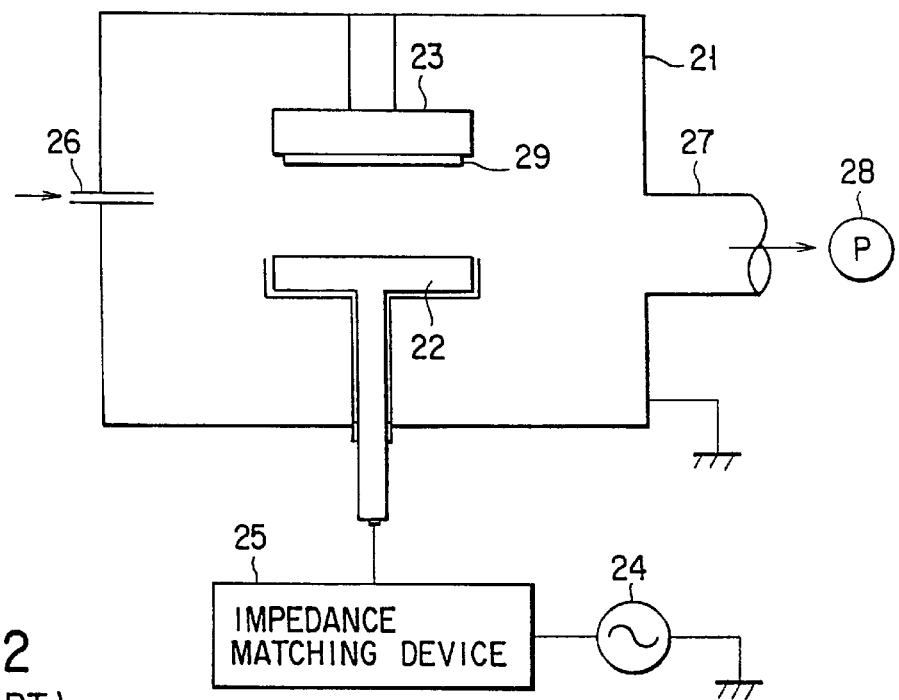
FIG. 12 shows the entire construction of a conventional plasma CVD apparatus using parallel plate electrodes.
Figure 13:
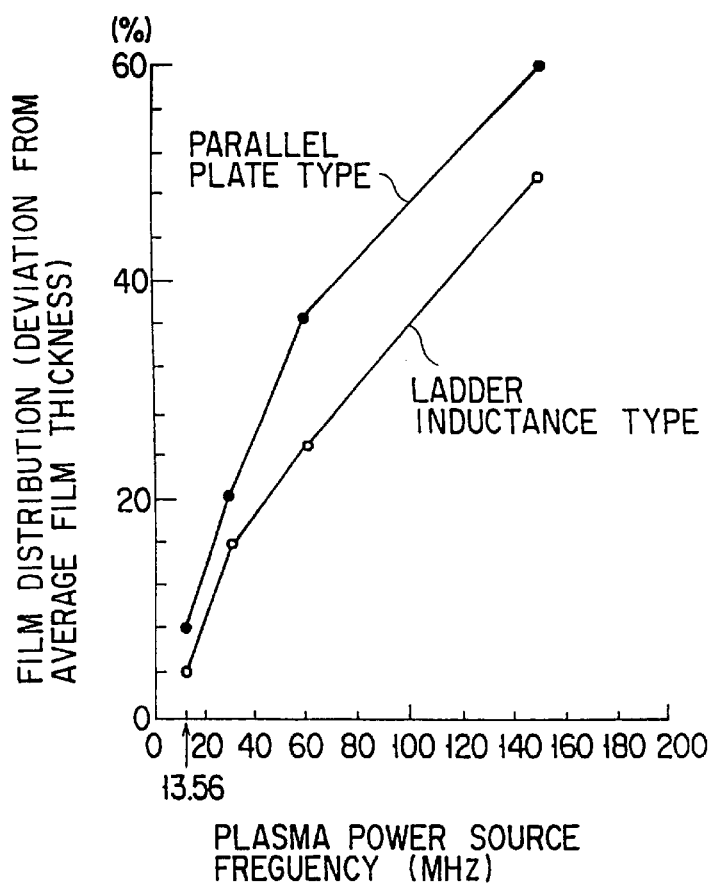
FIG. 13 is a graph showing the relationship between the frequency of the plasma power source and the film thickness distribution in the conventional apparatus.
Figure 14:
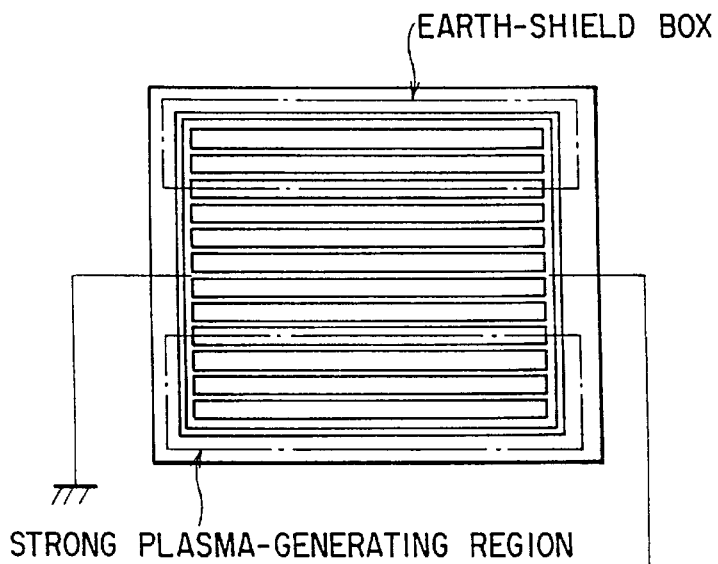
FIG. 14 shows the reason why non-uniformity of impedance takes place in the conventional device shown in FIG. 10.
Figure 15A:
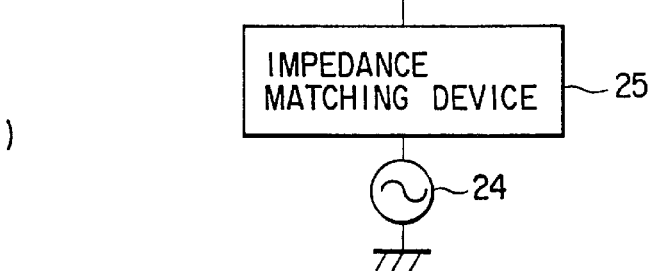
FIGS. 15A and 15B show how a peripheral portion and a central portion differ from each other in electrical characteristics in the conventional apparatus shown in FIG. 12.
Figure 15B:
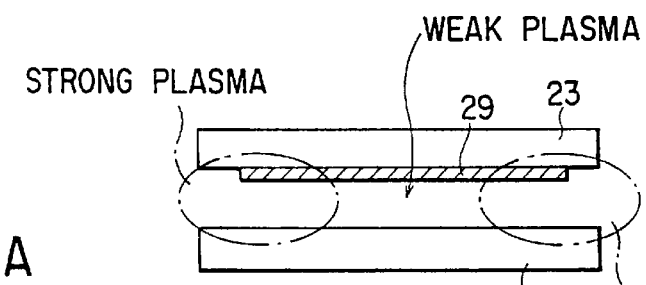

FIGS. 8 and 9 show the construction and the electrical wiring system of a plasma CVD apparatus according to a second embodiment of the present invention. As apparent from the drawings, the apparatus of the second embodiment shown in FIGS. 8 and 9 is substantially equal to the apparatus of the first embodiment shown in FIGS. 1 and 2, except that first and second ladder-shaped electrodes 32a, 32b for discharge generation are used in the second embodiment. Each of these first and second ladder-shaped electrodes 32a, 32b has an outer size of 572 mm×572 mm, and is formed of SUS 304 rods having a diameter of 6 mm. The distance between the centers of the adjacent SUS 304 rods is 26 mm. In the second embodiment, 8 coaxial cables 43a to 43h are connected to the power supply terminals 44 to 47 of the first ladder-shaped electrode 31a and to the power supply terminals 48 to 51 of the second ladder-shaped electrode 32b.

In forming an a-Si thin film by using the plasma CVD apparatus of the second embodiment shown in FIGS. 8 and 9, the vacuum pump 39 is operated in the first step so as to evacuate the reaction vessel 31 to establish a vacuum of 2 to $3\times10^{-7}$ Torr, followed by supplying a reactant gas of, for example, a $SiH_4$ gas into the reaction vessel 31 through the reactant gas introducing pipe 37 at a flow rate of about 1,000 to 1,600 SCCM. Then, a high frequency power of, for example, 60 MHz is supplied from the high frequency power source 36 to the first and second ladder-shaped electrodes 32a, 32b through the impedance matching device 35, the power distributor 60, the impedance converters 61a to 61h and the coaxial cables 43a to 43h for vacuum while maintaining the pressure within the reaction vessel 31 at about 0.05 to 0.5 Torr. As a result, a glow discharge plasma is generated in the vicinity of the first and second ladder-shaped electrodes 32a, 32b. The plasma thus generated decomposes the $SiH_4$ gas so as to form an a-Si thin film on the surface of the substrate 33.

Table 2 shows as an example the results of a film-forming experiment for Example 1.

TABLE 2

|  | Film forming rate | film thickness distribution (deviation from average thickness) |
|---|---|---|
| where the impedance converters 61a to 61h are not used | 1 nm/s | ±14% |
| where the impedance converters 61a to 61h are used | 1 nm/s | ±10% |

(power source frequency 60 MHz, substrate area 40 cm×100 cm)

In this experiment, an amorphous silicon (a-Si) thin film was formed on a glass plate having an area of 40 cm×100 cm and heated to 170° C. under a high frequency power of 800 W having a frequency of 60 MHz, a $SiH_4$ gas flow rate of 1000 SCCM, and a pressure of 0.13 Torr. Where the impedance converters 61a to 61h were not used, the film forming rate was found to be 1 nm/s and the film thickness distribution was found to be ±14%. On the other hand, in the case of using the impedance converts 61a to 61h, the film forming rate was found to be 1 nm/s and the film thickness distribution was found to be ±10%, indicating a marked improvement in the film thickness distribution.

The film thickness distribution for Example 2 was inferior to that for Example 1. However, since two ladder-shaped electrodes for discharge generation are used in Example 2, the substrate area on which a thin film of a-Si is formed in Example 2 is two times as large as that in Example 1. This is highly valuable in industries because the plasma CVD apparatus for Example 2 is adapted for mass production of a thin film.

As described previously, in the manufacture of an a-Si solar cell, a thin film transistor, a photosensitive drum, etc., no problem in performance is brought about, if the film thickness distribution is ±10% or less.

In the conventional plasma CVD apparatus, however, the film thickness distribution was markedly poor, i.e., ±30% to ±50%, in the case of using a high frequency power of 30 MHz or more, making it impossible to put the conventional apparatus to a practical use for forming a thin film on a large substrate having an area of about 30 cm×30 cm to 50 cm×50 cm.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma chemical vapor deposition apparatus for forming an amorphous thin film, a microcrystalline thin film or a polycrystalline silicon thin film on a surface of a target substrate by utilizing a glow discharge generated by an electric power supplied from a power source, comprising:

a reaction vessel connected to the ground;

means for supplying a reactant gas into said reaction vessel;

discharge means for discharging a waste gas of said reactant gas out of said reaction vessel;

a ladder-shaped electrode arranged in the reaction vessel and comprising two sidepieces and a series of rungs arranged between the two sidepieces, for discharging electricity;

a power source for uniformly supplying a high frequency power of 30 MHZ to 200 MHZ to said ladder-shaped electrode for a glow discharge generation;

power supply terminals mounted on each of the sidepieces of said ladder-shaped electrode, for supplying power to said ladder-shaped electrode, the power supply terminals mounted on one sidepiece facing the power supply terminals mounted on another sidepiece that is opposite to said one sidepiece;

a heater for heating and supporting a target substrate, said heater being arranged within the reaction vessel apart from and in parallel to said ladder-shaped electrode for discharge generation; and a power distributor for uniformly distributing a high frequency power for glow discharge generation to at least two power supply terminals mounted to said ladder-shaped electrode, said power distributor comprising a high frequency transformer of 30 MHZ to 200 MHZ, a resistor and a capacitor.

2. The plasma chemical vapor deposition apparatus according to claim 1, wherein an impedance converter is interposed between said ladder-shaped electrode and said power distributor such that said impedance converter is electrically connected at one end to the ladder-shaped electrode and to the power distributor at the other end.

3. The plasma chemical vapor deposition apparatus according to claim 1, wherein said high frequency transformer comprises an annular body made of a magnetic material and two electrical wires covered with an insulating material and connected at one end to a single terminal and branched at the other end portion so as to be connected to two terminals.

4. The plasma chemical vapor deposition apparatus according to any one of claims 1, 2 or 3 wherein a plurality of ladder-shaped electrodes for discharge generatin are arranged within a plane parallel to the heater for heating the substrate.

* * * * *